(12) United States Patent
Motoda

(10) Patent No.: US 8,563,343 B2
(45) Date of Patent: Oct. 22, 2013

(54) METHOD OF MANUFACTURING LASER DIODE DEVICE

(75) Inventor: Takashi Motoda, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 13/474,126

(22) Filed: May 17, 2012

(65) Prior Publication Data

US 2013/0065335 A1    Mar. 14, 2013

(30) Foreign Application Priority Data

Sep. 8, 2011 (JP) ................................. 2011-196286

(51) Int. Cl.
*H01L 33/00* (2010.01)

(52) U.S. Cl.
USPC ............... 438/33; 438/30; 438/113; 438/311; 438/460; 257/237; 257/238; 257/E21.085; 257/E21.238

(58) Field of Classification Search
USPC .......................................................... 438/33
See application file for complete search history.

(56) References Cited

U.S. PATENT DOCUMENTS

| | | | | |
|---|---|---|---|---|
| 3,805,123 | A * | 4/1974 | Rieger | 257/717 |
| 5,284,792 | A * | 2/1994 | Forster et al. | 438/29 |
| 5,373,174 | A * | 12/1994 | Yamamoto | 257/88 |
| 5,608,716 | A * | 3/1997 | Koyama et al. | 369/275.1 |
| 5,972,781 | A * | 10/1999 | Wegleiter et al. | 438/460 |
| 6,482,666 | B1 * | 11/2002 | Kobayashi et al. | 438/33 |
| 6,630,366 | B2 * | 10/2003 | Taniguchi et al. | 438/34 |
| 7,012,012 | B2 * | 3/2006 | Yeom et al. | 438/462 |
| 7,183,136 | B2 * | 2/2007 | Hashimura et al. | 438/113 |
| 7,368,756 | B2 * | 5/2008 | Bruhns et al. | 257/93 |
| 7,649,923 | B2 * | 1/2010 | Sakamoto et al. | 372/54 |
| 7,903,713 | B2 * | 3/2011 | Karino | 372/50.12 |
| 8,211,781 | B2 * | 7/2012 | Saito et al. | 438/458 |
| 8,404,566 | B2 * | 3/2013 | Lee | 438/463 |
| 8,481,352 | B2 * | 7/2013 | Lee et al. | 438/33 |
| 2002/0001327 | A1 * | 1/2002 | Goto | 372/45 |
| 2003/0190770 | A1 * | 10/2003 | Yeom et al. | 438/113 |
| 2005/0186760 | A1 * | 8/2005 | Hashimura et al. | 438/460 |
| 2006/0097278 | A1 * | 5/2006 | Goto et al. | 257/103 |
| 2007/0121692 | A1 * | 5/2007 | Kawakami et al. | 372/43.01 |
| 2007/0264802 | A1 * | 11/2007 | Sakamoto et al. | 438/478 |

(Continued)

FOREIGN PATENT DOCUMENTS

| | | |
|---|---|---|
| JP | 6-5703 A | 1/1994 |
| JP | 8-111563 A | 4/1996 |
| JP | 10-125958 A | 5/1998 |
| JP | 2009-71162 A | 4/2009 |

*Primary Examiner* — N Drew Richards
*Assistant Examiner* — Ankush Singal
(74) *Attorney, Agent, or Firm* — Leydig, Voit & Mayer, Ltd.

(57) ABSTRACT

A method of manufacturing a laser diode device includes: forming, in a semiconductor laser bar, separation trenches extending across all of a transverse dimension of the semiconductor laser bar and defining a mesa stripe, each of the separation trenches having wide portions located at longitudinal edge portions of the semiconductor laser bar and a narrow portion located in a longitudinal central portion of the semiconductor laser bar; scribing, in the semiconductor laser bar, grooves extending parallel to the separation trenches and terminating before reaching longitudinal edge portions of the semiconductor laser bar; and splitting the semiconductor laser bar along the grooves to form cleaved surfaces extending from a bottom surface of the semiconductor laser bar to bottom surfaces of the separation trenches.

5 Claims, 5 Drawing Sheets

(56) References Cited

U.S. PATENT DOCUMENTS

| | | | |
|---|---|---|---|
| 2008/0191226 A1* | 8/2008 | Urashima | 257/98 |
| 2008/0304528 A1* | 12/2008 | Yamamoto et al. | 372/44.011 |
| 2009/0122822 A1 | 5/2009 | Murayama | |
| 2009/0245313 A1* | 10/2009 | Karino | 372/46.012 |
| 2009/0267100 A1* | 10/2009 | Miyake et al. | 257/98 |
| 2010/0120237 A1* | 5/2010 | Tanaka et al. | 438/507 |
| 2010/0233835 A1* | 9/2010 | Kusunoki | 438/33 |
| 2011/0183453 A1* | 7/2011 | Hironaka et al. | 438/33 |
| 2011/0211869 A1* | 9/2011 | Shouji et al. | 399/177 |
| 2012/0108011 A1* | 5/2012 | Hata et al. | 438/113 |
| 2012/0187449 A1* | 7/2012 | Negishi | 257/184 |

* cited by examiner

METHOD OF MANUFACTURING LASER DIODE DEVICE

BACKGROUND OF THE INVENTION

1. Field of the Invention

The present invention relates to a method of manufacturing a laser diode device used, e.g., for industrial equipment, etc.

2. Background Art

Japanese Laid-Open Patent Publication No. 2009-71162 discloses a technique for splitting or cleaving a semiconductor laser bar along the desired planes into individual laser diode devices. In this technique, first, separation trenches are formed in a semiconductor laser bar so as to extend across the entire transverse dimension of the semiconductor laser bar, thereby forming mesa stripes. The semiconductor laser bar is then cleaved by causing crack propagation from grooves which have been scribed in the semiconductor laser bar along the separation trenches.

It should be noted that such scribing is achieved by means of a pointed tool, such as a diamond needle, which, however, cannot be stabbed into the edge portions of the semiconductor laser bar. As a result, the semiconductor laser bar must be cleaved without scribed grooves in the edge portions thereof. In this case, it has been found that the resulting cleaved surfaces sometimes have cracks or chippings of considerable magnitude, resulting in reduced yield. Especially in some cases, the crack propagation is such that the resulting cleaved surfaces extend to a mesa stripe, also resulting in reduced yield.

SUMMARY OF THE INVENTION

The present invention has been made to solve the above problems. It is, therefore, an object of the present invention to provide a method of manufacturing a laser diode device whereby it is possible to increase the manufacturing yield. The features and advantages of the present invention may be summarized as follows.

According to one aspect of the present invention, a method of manufacturing a laser diode device, includes the steps of forming, in a semiconductor laser bar, separation trenches extending across the entire transverse dimension of the semiconductor laser bar so as to form a mesa stripe, each of the separation trenches having wide portions formed in longitudinal edge portions of the semiconductor laser bar and a narrow portion formed in a longitudinal central portion of the semiconductor laser bar, scribing, in the semiconductor laser bar, grooves extending parallel to the separation trenches and terminating short of the longitudinal edge portions of the semiconductor laser bar, and by causing crack propagation from the grooves, splitting the semiconductor laser bar along the grooves so as to form cleaved surfaces extending from a bottom surface of the semiconductor laser bar to bottom surfaces of the separation trenches, the bottom surface of the semiconductor laser bar being opposite to the surface of the semiconductor laser bar in which the separation trenches are formed.

According to another aspect of the present invention, a method of manufacturing a laser diode device, includes the steps of forming, in a semiconductor laser bar, V-shaped trenches extending across the entire transverse dimension of the semiconductor laser bar so as to form a mesa stripe, and by causing crack propagation from the V-shaped trenches, splitting the semiconductor laser bar along the V-shaped trenches so as to form cleaved surfaces extending from the tips of the V-shaped trenches to a bottom surface of the semiconductor laser bar, the bottom surface being opposite to the surface of the semiconductor laser bar in which the V-shaped trenches are formed.

Other and further objects, features and advantages of the invention will appear more fully from the following description.

DETAILED DESCRIPTION OF THE PREFERRED EMBODIMENTS

First Embodiment

Figure 1:
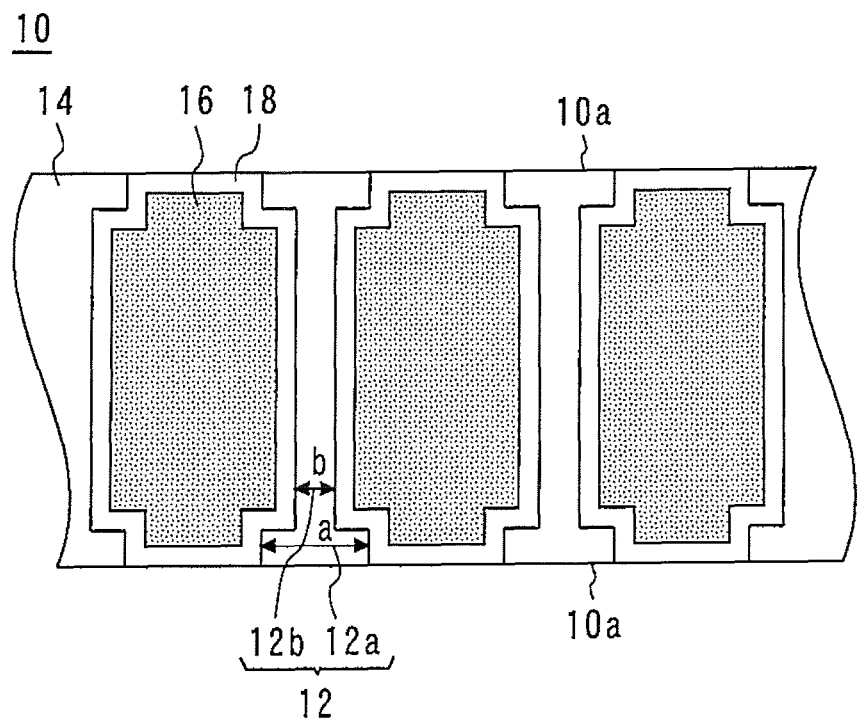
FIG. 1 is a diagram showing the separation trenches of the first embodiment after they have been formed.

A method of manufacturing a laser diode device in accordance with a first embodiment of the present invention will be described with reference to accompanying drawings. First, separation trenches are formed in a semiconductor laser bar. FIG. 1 is a diagram showing the separation trenches of the first embodiment after they have been formed. Specifically, the separation trenches 12 are formed to extend across the entire transverse dimension of the semiconductor substrate 10. Each separation trench 12 has wide portions 12a in the longitudinal edge portions of the semiconductor laser bar 10 (which include their respective edges 10a), and also has a narrow portion 12b in the longitudinal central portion of the semiconductor laser bar 10. Each narrow portion 12b is sandwiched between two wide portions 12a.

The width of the wide portions 12a is indicated by the letter a, and the width of the narrow portions 12b is indicated by the letter b. Each wide portion 12a is formed to extend a few tens of microns from the respective edge 10a toward the longitudinal central portion of the semiconductor laser bar 10. The formation of the separation trenches 12 results in the formation of mesa stripes in the semiconductor laser bar 10. FIG. 1 shows an electrode 16 and a contact layer 18 of each mesa stripe.

Figure 2:
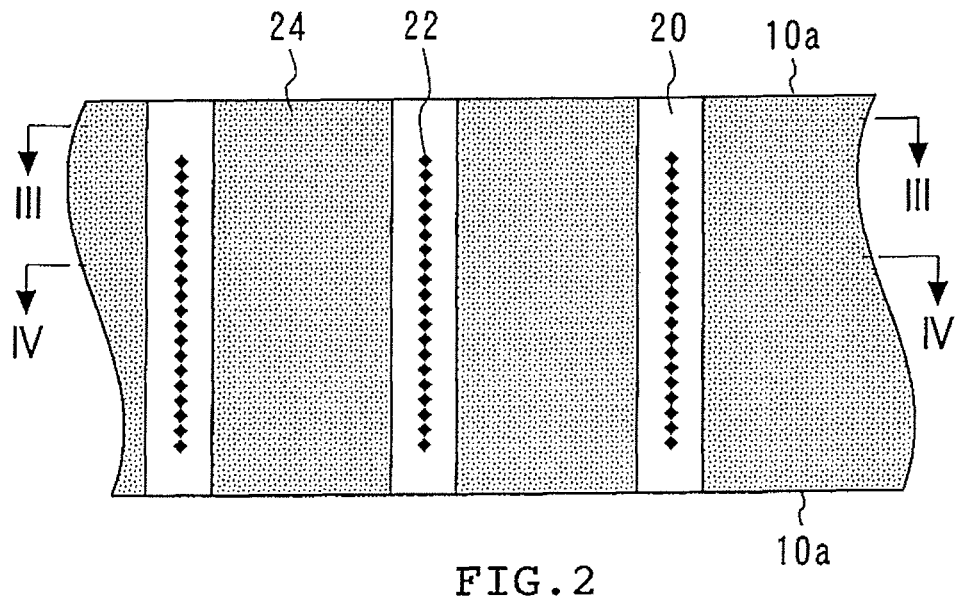
FIG. 2 is a diagram showing the grooves in the bottom surface of the semiconductor laser bar of the first embodiment after they have been scribed.

Next, grooves are scribed in the bottom surface of the semiconductor laser bar 10. The bottom surface of the semiconductor laser bar 10 is opposite to the surface of the semiconductor laser bar 10 in which the separation trenches 12 are formed. FIG. 2 is a diagram showing the grooves in the bottom surface of the semiconductor laser bar of the first embodiment after they have been scribed. Specifically, the grooves 22 are scribed in the bottom surface 20 of the semiconductor laser bar directly below the separation trenches 12 by means of, e.g., a diamond needle whose tip is formed of diamond. The length of the scribed grooves 22 in the transverse direction of the semiconductor laser bar 10 is equal to the length of the narrow portions 12b in that direction. Further, the scribed grooves 22 extend parallel to the separation trenches 12. Since the diamond needle cannot be stabbed into the edge portions of the semiconductor laser bar 10, the scribed grooves 22 extend toward but terminate short of the longitudinal edge portions of the semiconductor laser bar 10.

Figure 3:
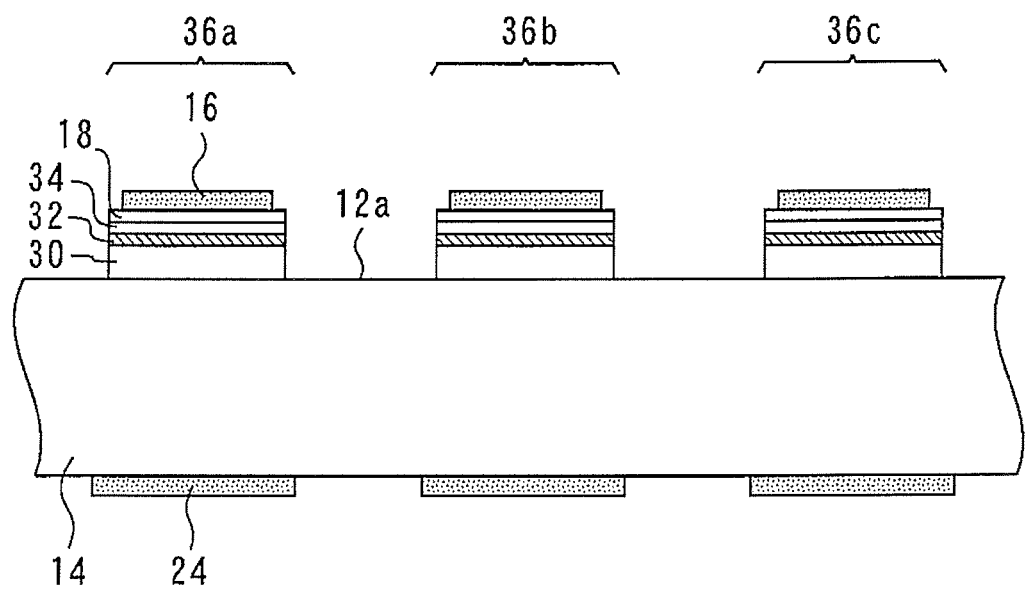
FIG. 3 is a cross-sectional view taken along line III-III of FIG. 2.

Next, electrodes 24 is formed on the bottom surface 20 of the semiconductor laser bar 10. The electrodes 24 are formed on the areas of the bottom surface of the semiconductor laser bar 10 where the scribed grooves 22 are not located. The electrodes 24 may be formed at the same time as the electrodes 16. FIG. 3 is a cross-sectional view taken along line III-III of FIG. 2. In the mesa stripes, a lower cladding layer 30 is formed on the semiconductor substrate 14. An active layer 32 is formed on the lower cladding layer 30. An upper cladding layer 34 is formed on the active layer 32. A contact layer 18 is formed on the upper cladding layer 34. A electrode 16 is formed on the contact layer 18. In the longitudinal edge portions of the semiconductor laser bar 10, the wide portions 12a of the separation trenches 12 form and define the mesa stripes 36a, 36b, and 36c. Thus, the mesa stripes are spaced considerably from one another by the wide portions 12a.

Figure 4:
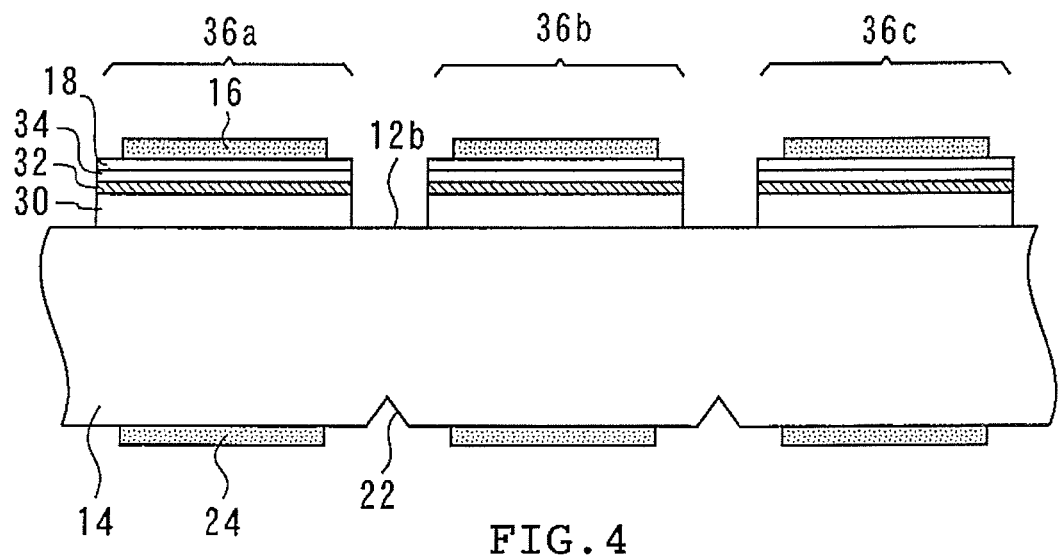
FIG. 4 is a cross-sectional view taken along line IV-IV of FIG. 2.

FIG. 4 is a cross-sectional view taken along line IV-IV of FIG. 2. In the longitudinal central portion of the semiconductor laser bar 10, the narrow portions 12b of the separation trenches 12 form and define the mesa stripes 36a, 36b, and 36c. That is, the spacing between the mesa stripes is smaller in the longitudinal central portion of the semiconductor laser bar 10 than in the longitudinal edge portions of the semiconductor laser bar 10. As can be seen from FIGS. 3 and 4, the separation trenches 12 are etched through the contact layer 18 and underlying layers down to and including the lower cladding layer 30.

Figure 5:
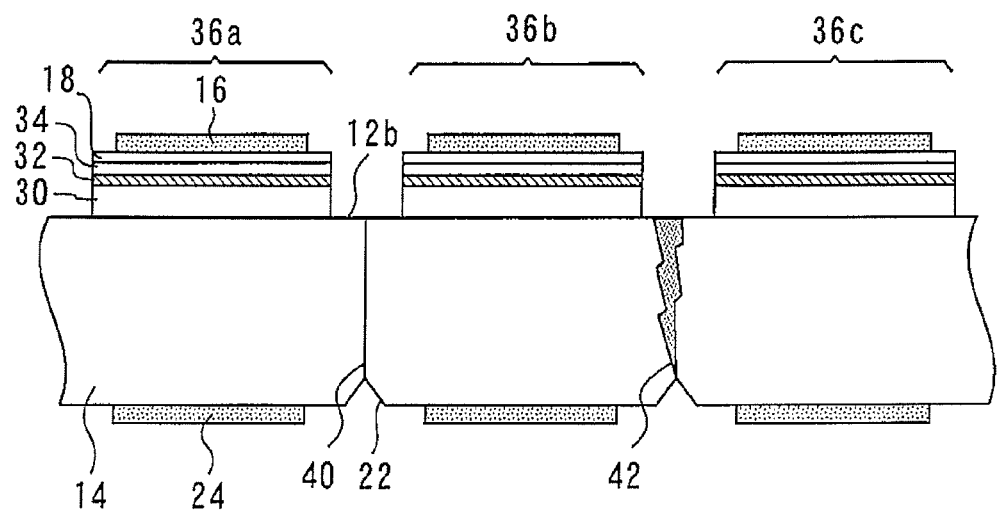
FIG. 5 is a cross-sectional view of the longitudinal central portion of the semiconductor laser bar of the first embodiment after the semiconductor laser bar has been cleaved, with the longitudinal central portion having the narrow portions of the separation trenches formed therein.

Next, the semiconductor laser bar is cleaved to produce cleaved surfaces. FIG. 5 is a cross-sectional view of the longitudinal central portion of the semiconductor laser bar of the first embodiment after the semiconductor laser bar has been cleaved, with the longitudinal central portion having the narrow portions of the separation trenches formed therein. Specifically in this step, the semiconductor laser bar 10 is cleaved along the scribed grooves 22 by causing crack propagation from these grooves, thereby forming cleaved surfaces extending from the bottom surface 20 of the semiconductor laser bar 10 to the bottom surfaces of the separation trenches 12. If this cleavage operation is successful, the resulting cleaved surfaces of the longitudinal central portion of the semiconductor laser bar are flat like the cleaved surface 40 shown in FIG. 5. It should be noted, however, that there is always some probability that a cleaved surface having cracks, like the cleaved surface 42 shown in FIG. 5, will appear. However, since the scribed grooves 22 extend along the entire length of the narrow portions 12b, and the semiconductor laser bar is cleaved by causing crack propagation from these scribed grooves 22, there is no possibility that the cleaved surfaces of the longitudinal central portion of the semiconductor laser bar are significantly slanted or have substantial cracks.

Figure 6:
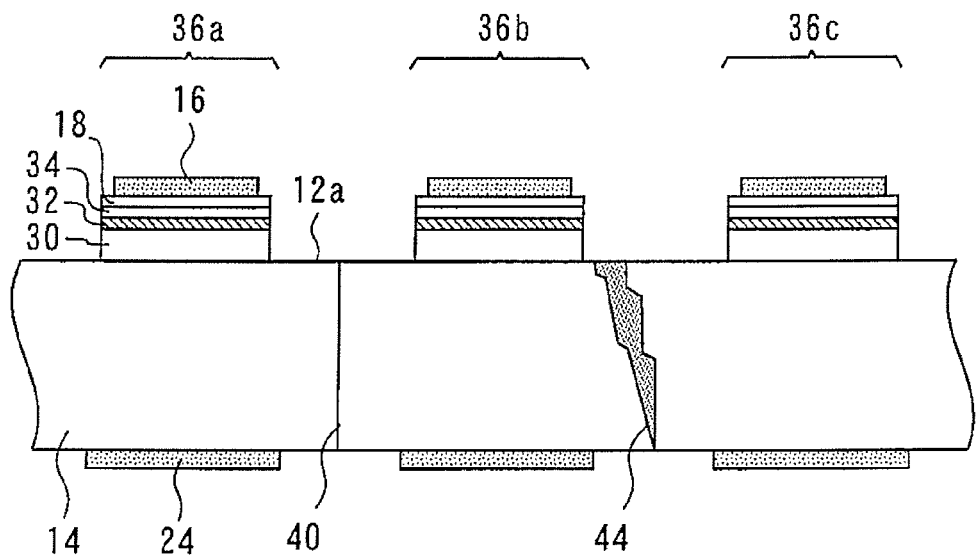
FIG. 6 is a cross-sectional view of the longitudinal edge portions of the semiconductor laser bar of the first embodiment after the semiconductor laser bar has been cleaved, with the longitudinal edge portions having the wide portions of the separation trenches formed therein.

FIG. 6 is a cross-sectional view of the longitudinal edge portions of the semiconductor laser bar of the first embodiment after the semiconductor laser bar has been cleaved, with the longitudinal edge portions having the wide portions of the separation trenches formed therein. If the cleavage operation is successful, the resulting cleaved surfaces of the longitudinal edge portions are flat like the cleaved surface 40 shown in FIG. 6. It should be noted, however, that there is always some probability that a cleaved surface having cracks, like the cleaved surface 44 shown in FIG. 6, will appear. Furthermore, the longitudinal edge portions of the semiconductor laser bar 10, which have the wide portions 12a of the separation trenches 12 formed therein, have no scribed grooves therein for inducing cleavage crack formation and propagation. Therefore, there is possibility that the cleaved surfaces of the longitudinal edge portions of the semiconductor laser bar 10 are significantly slanted. However, even if that is the case, the slanted cleaved surfaces do not extend into the mesa stripes, since the width of the wide portions 12a is greater than that of the narrow portions 12b.

In the laser diode device manufacturing method of the first embodiment, the separation trenches 22 are formed in the semiconductor laser bar 10 in such a manner that the wide portions 12a of the separation trenches 22 are located in the longitudinal edge portions of the semiconductor laser bar 10, since grooves cannot be scribed in these edge portions. Due to this configuration, when the semiconductor laser bar 10 is cleaved, the resulting cleaved surfaces of the longitudinal edge portions of the semiconductor laser bar 10 do not extend into the mesa stripes even if these cleaved surfaces are slanted, making it possible to prevent faulty cleavage of the semiconductor laser bar and thereby increase the yield of laser diode devices.

It should be noted that since the electrodes 16 are subjected to die bonding or wire bonding, they preferably have a large surface area. In order to increase the surface area of the electrodes 16, however, it is necessary to minimize the surface area of the separation trenches 12, since an increase in the surface area of the separation trenches 12 requires a decrease in the surface area of the electrodes 16. In the laser diode device manufacturing method of the first embodiment, since the wide portions 12a of the separation trenches 12 are formed only in the longitudinal edge portions of the semiconductor laser bar 10 (and the narrow portions 12b of the separation trenches 12 are formed in the longitudinal central portion of the semiconductor laser bar 10), the entire surface of the separation trenches 12 is smaller than would be the case if the wide portions 12a of the separation trenches 12 were formed in the longitudinal central portion of the semiconductor laser bar 10 as well as in the longitudinal edge portions thereof.

Figure 7:
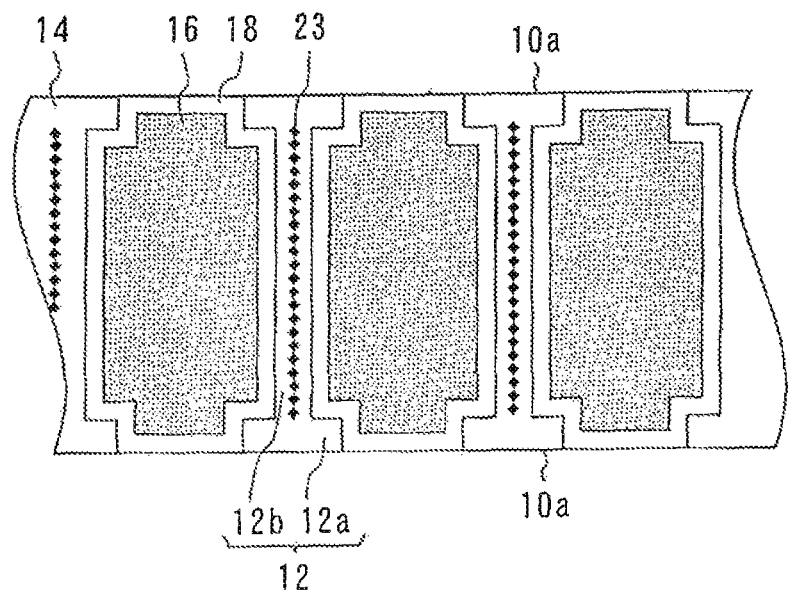
FIG. 7 is a diagram showing grooves scribed in the bottom surfaces of the separation trenches.

Various alterations may be made to the laser diode device manufacturing method of the first embodiment. The scribed grooves can be disposed at any location as long as they extend parallel to the separation trenches. For example, the scribed grooves may be disposed in the bottom surfaces of the separation trenches. FIG. 7 is a diagram showing grooves scribed in the bottom surfaces of the separation trenches. Specifically, the scribed grooves 23 extend along the separation trenches 12 and have a length equal to that of the narrow portions 12b of the separation trenches 12.

Although in the laser diode device manufacturing method of the first embodiment the length of the narrow portions 12b of the separation trenches 12 is equal to that of the scribed grooves 22 or 23, it is to be understood that the present invention is not limited to this particular embodiment. For example, the wide portions 12a may be formed to extend directly over (or directly under) the scribed grooves 22. In this case, the surface area of the wide portions 12a is greater than in the first embodiment. As a result, it is possible to more effectively prevent faulty cleavage of the semiconductor laser bar wherein a cleaved surface extends into a mesa stripe.

The steps prior to the semiconductor laser bar cleaving step are not limited to any particular sequence. For example, the electrodes 16 and 24 may be formed after the grooves 22 are scribed. Further, the only requirement for the separation trenches 12 is that they be formed by etching so as to extend through the active layer 32. Therefore, for example the separation trenches may be formed to extend halfway into the lower cladding layer 30 so that the remaining portion of the lower cladding 30 is exposed at the bottom surfaces of the separation trenches.

Although the foregoing description of the laser diode device manufacturing method of the first embodiment does not describe the details of the structures of the plurality of semiconductor layers (epi layers), it is to be understood that the plurality of semiconductor layers can have any structure as long as one of them is an active layer. It should be noted that the active layer may be formed to have a QW, MQW, or SCH structure, etc. The present invention may be applied to all types of laser diode devices having an active layer.

The material of the electrodes 16 and 24 may be, but is not limited to, gold, platinum, titanium, molybdenum, tantalum, nickel, or the like, or a multilayer film thereof. Further, the electrodes 16 and 24 may be plated with gold.

Second Embodiment

A method of manufacturing a laser diode device in accordance with a second embodiment of the present invention will be described with reference to accompanying drawings. Features of the second embodiment that are common to the first embodiment will not be described herein.

Figure 8:
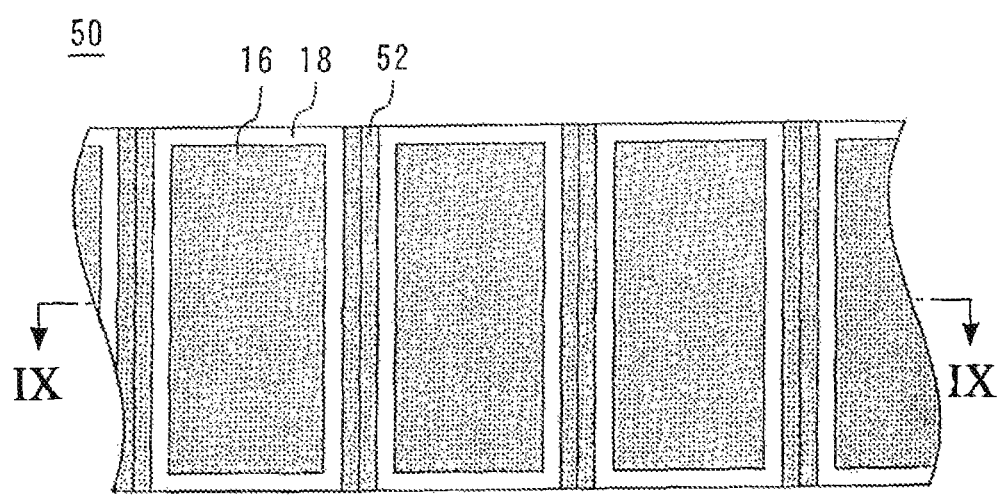
FIG. 8 is a diagram showing the V-shaped trenches of the second embodiment after they have been formed.

First, V-shaped trenches are formed in a semiconductor laser bar. FIG. 8 is a diagram showing the V-shaped trenches of the second embodiment after they have been formed. Specifically, the V-shaped trenches 52 are formed in the semiconductor laser bar 50 so as to extend across the entire transverse dimension of the semiconductor laser bar 50. The formation of the V-shaped trenches 52 is effected by wet etching. The formation of the V-shaped trenches 52 results in the formation of mesa stripes.

Figure 9:
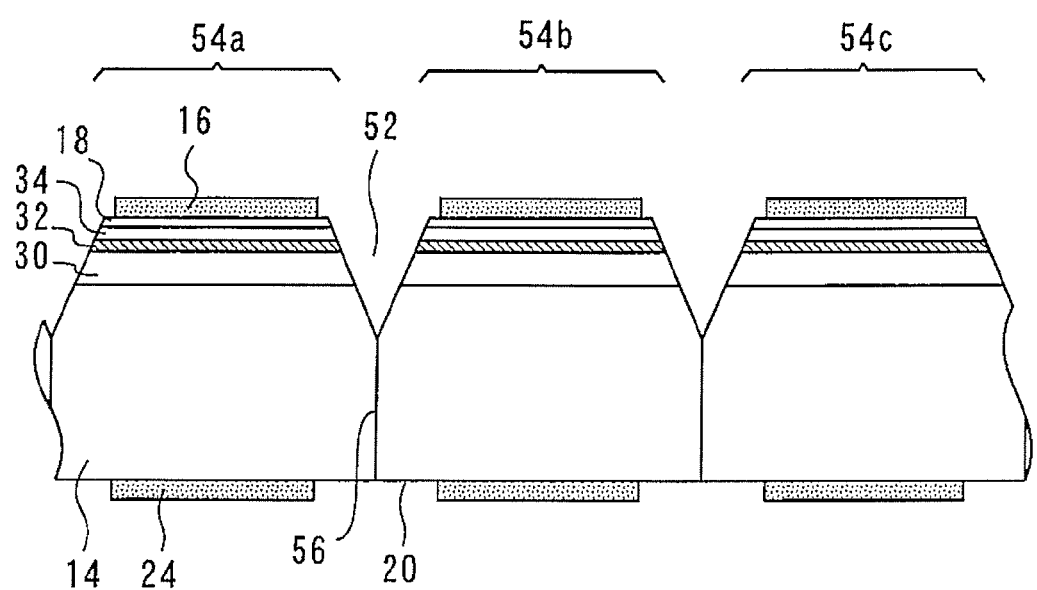
FIG. 9 is a cross-sectional view taken along line IX-IX of FIG. 8.

Next, the semiconductor laser bar 50 is cleaved along the V-shaped trenches 52 by causing crack propagation from these trenches. FIG. 9 is a cross-sectional view taken along line IX-IX of FIG. 8. Since the mesa stripes 54a, 54b, and 54c are formed and defined by the V-shaped trenches 52, the side surfaces of these mesa stripes are slanted with respect to the surfaces of the semiconductor substrate 14. The semiconductor laser bar 50 is cleaved in such a manner that the resulting cleaved surfaces extend from the vertices of the V-shaped trenches 52 to the bottom surface 20 of the semiconductor laser bar 50. The bottom surface of the semiconductor laser bar 50 is opposite to the surface of the semiconductor laser bar 50 in which the V-shaped trenches 52 are formed. Since the V-shaped trenches 52 are formed to extend across the entire transverse dimension of the semiconductor laser bar 50, when the semiconductor laser bar 50 is cleaved, the cleaved surfaces of the resulting laser diode devices are flat throughout, like the cleaved surface 56 shown in FIG. 9.

In the laser diode device manufacturing method of the first embodiment described above, the semiconductor laser bar is provided with both separation trenches and scribed grooves. In the laser diode device manufacturing method of the second embodiment, on the other hand, the semiconductor laser bar is provided with only V-shaped trenches instead of those separation trenches and scribed grooves. However, the semiconductor laser bar of the second embodiment can still be cleaved in such a manner that the resulting cleaved surfaces are of high quality. This means that the laser diode device manufacturing method of the second embodiment has an advantage over that of the first embodiment. It should be noted that the laser diode device manufacturing method of the second embodiment is susceptible of alterations at least similar to those that can be made to the first embodiment.

The present invention makes it possible to cleavage a semiconductor laser bar while preventing any cracks resulting from the cleavage from reaching the mesa stripes.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2011-196286, filed on Sep. 8, 2011, including specification, claims, drawings, and summary, on which the Convention priority of the present application is based, is incorporated herein by reference in its entirety.

What is claimed is:

1. A method of manufacturing a laser diode device, comprising:
    forming a semiconductor laser bar including a semiconductor substrate having opposed front and rear surfaces and including, sequentially stacked on the front surface, a lower cladding layer, an active layer, an upper cladding layer, and a contact layer, wherein said semiconductor laser bar includes first and second spaced apart edges;
    forming, in said semiconductor laser bar, separation trenches extending transverse to and entirely from said first edge to said second edge of said semiconductor laser bar, wherein
        each closest pair of said separation trenches defines a mesa stripe between the pair of said separation trenches,
        each of said separation trenches has first and second wider portions respectively located along the first and second edges of said semiconductor laser bar and a narrower portion extending between and connected to said first and second wider portions of said separation trench, and
        said narrower portion is narrower at said front surface of said semiconductor substrate, in a direction parallel to said first and second edges, than said wider portions at said front surface of said semiconductor substrate;
    scribing, in said semiconductor laser bar, grooves extending parallel to said separation trenches, wherein said grooves do not extend fully between said first and second edges of said semiconductor laser bar and terminate before reaching said first and second edges of said semiconductor laser bar; and
    propagating cracks from said grooves, splitting said semiconductor laser bar along said grooves and forming cleaved surfaces extending from said bottom surface of said semiconductor substrate of said semiconductor laser bar to said separation trenches.

2. The method according to claim 1, including scribing said grooves in said rear surface of said semiconductor substrate of said semiconductor laser bar directly opposite said separation trenches.

3. The method according to claim 1, including scribing said grooves in said front surface of said semiconductor substrate of said semiconductor laser bar, in said separation trenches.

4. The method according to claim 1, wherein said narrower portions of said separation trenches and said grooves have lengths, transverse to said first and second edges of said semiconductor laser bar that are equal.

5. A method of manufacturing a laser diode device, comprising:

forming a semiconductor laser bar including a semiconductor substrate having opposed front and rear surfaces and including, sequentially stacked on the front surface, a lower cladding layer, an active layer, an upper cladding layer, and a contact layer;

forming, in said semiconductor laser bar, at least two V-shaped trenches extending across all of a transverse dimension of said semiconductor laser bar wherein each closest pair of said V-shaped trenches defines a mesa stripe between the pair of said V-shaped trenches, each V-shaped trench includes a pair of planar surfaces that are oblique to said front surface of said semiconductor substrate and that intersect with each other at a vertex of said V-shaped groove, located in said semiconductor substrate between said front and rear surfaces of said semiconductor substrate of said semiconductor laser bar, and each of said planar surfaces of each of said V-shaped grooves includes oblique side surfaces of said lower cladding layer, said active layer, said upper cladding layer, and said contact layer of one of said mesa stripes; and propagating cracks in said semiconductor substrate from said vertices of at least two of said V-shaped trenches, splitting said semiconductor laser bar along said V-shaped trenches, and forming cleaved surfaces extending from said vertices of said V-shaped trenches to said bottom surface of said semiconductor substrate of said semiconductor laser bar.

* * * * *